United States Patent [19]
Arai et al.

[11] Patent Number: 5,672,973
[45] Date of Patent: Sep. 30, 1997

[54] APPARATUS FOR MONITORING BATTERY RESIDUAL CAPACITY IN MULITPLE MODES

[75] Inventors: Youichi Arai; Tsutomu Saigo, both of Shizuoka-ken, Japan

[73] Assignee: Yazaki Corporation, Tokyo, Japan

[21] Appl. No.: 628,338

[22] Filed: Apr. 5, 1996

[30] Foreign Application Priority Data

Apr. 7, 1995 [JP] Japan .................................. 7-082372

[51] Int. Cl.[6] .................................................. G01N 27/416
[52] U.S. Cl. ..................... 324/427; 324/429; 320/48; 364/481; 340/636
[58] Field of Search ......................... 324/426, 427, 324/428, 429, 433, 771; 320/48, 44; 340/636; 364/481, 550, 551.01

[56] References Cited

U.S. PATENT DOCUMENTS

| | | | |
|---|---|---|---|
| 4,390,841 | 6/1983 | Martin et al. | 324/427 |
| 4,849,700 | 7/1989 | Morioka et al. | 324/427 |
| 5,287,286 | 2/1994 | Ninomiya | 320/48 X |
| 5,473,262 | 12/1995 | Yoshimatsu | 324/429 X |
| 5,479,085 | 12/1995 | Honda et al. | 324/425 X |

FOREIGN PATENT DOCUMENTS 8-62310 3/1996 Japan .

Primary Examiner—Ernest F. Karlsen
Assistant Examiner—Diep Do
Attorney, Agent, or Firm—Finnegan, Henderson, Farabow, Garrett & Dunner, L.L.P.

[57] ABSTRACT

When a car is moved, a current and a voltage from a battery change and a power-supply voltage of a sub-battery is not lower than a manipulation level, an approximately linear function is obtained according to a current from a buttery and a terminal voltage, and residual capacity is displayed according to the approximately linear function. When the car is stopped and the current and the voltage of the battery do not change, the residual capacity is obtained according to the voltage. Moreover, when a power source supplying control circuit judges that an ignition is turned off, a voltage of the power source is lowered to the manipulation level so as to be supplied for prescribed time required for the battery becoming constant.

5 Claims, 3 Drawing Sheets

APPARATUS FOR MONITORING BATTERY RESIDUAL CAPACITY IN MULITPLE MODES

BACKGROUND OF THE INVENTION

1. Field of the Invention

The present invention relates to a battery residual capacity measuring apparatus, more specifically, control in an apparatus using a battery when a power source is stopped or supplied from auxiliary power.

2. Description of the Related Art

In general, since an electric car moves by means of a battery, battery residual capacity should be predicted accurately. Examples of methods for measuring battery residual capacity are as follows:

(1) a current integrating method for measuring and integrating an amount of currents to be supplied from a battery to a load side so as to predict its residual capacity according to the current integrated value and an amount of currents at the time of charging;

(2) a voltage detecting method for measuring terminal voltages when discharge currents are supplied from an terminal of a battery to its load side so as to predict its residual capacity;

(3) an electrolyte solution specific gravity method for measuring specific gravity of an electrolyte solution in a battery so as to predict residual capacity;

(4) an open-circuit voltage detecting method for releasing a battery from load and measuring a terminal voltage in the open state so as to predict residual capacity; and (5) an internal resistance measuring method for measuring a change in internal resistance of a battery so as to predict residual capacity.

For example, in a battery residual capacity measuring apparatus adopting the voltage detecting method (2) disclosed in Japanese Patent Application No. 6-200953/1994 (Tokuganhei 6-200953), terminal voltages of a battery and currents supplied to load are read by sampling them per 1 ms, for example, data up to 100 ms, for example, are collected and averaged. Then, a hundred of the averaged voltages and currents (hereinafter, referred to as dispersion data) are collected so that an approximate straight line is obtained by the least square method.

Next, a correlation coefficient "r" is obtained according to the dispersion data of the voltages and the currents, and a judgment is made as to whether the obtained correlation coefficient "r" is not more than −0.9. When it is not more than −0.9, a voltage value corresponding to a predetermined discharge current is calculated. Then, the obtained voltage value is converted into battery residual capacity, and the obtained battery residual capacity is displayed.

In addition, a discharge characteristic of a battery varies with a temperature. For this reason, in the battery residual capacity measuring apparatus disclosed in Japanese Patent Application 6-200953/1994 (Tokuganhei 6-200953), a temperature sensor is mounted to the battery (an auxiliary battery which is different from a main battery) so that residual capacity is calculated according to a temperature value of the temperature sensor.

However, in the voltage detecting method, since a voltage always changes, it is not easy to collect data. In the open-circuit voltage detecting method, while a car is moving, its circuit is not opened, and in the current integrating method, since currents are integrated and averaged, complicated calculation is required. Moreover, in the internal resistance measuring method and the electrolyte solution specific gravity method, it is difficult to measure internal resistance and specific gravity of a electrolyte solution while a car is moving, and these methods is not preferable as to accuracy and price.

In addition, generally, immediately after supplying of a power source from a battery is stopped, an open-circuit voltage is not gained.

For this reason, in the case where immediately after an ignition is turned off, it is again turned on, an open-circuit voltage is not obtained. Nevertheless, its initial residual capacity can be obtained according to a terminal voltage of the battery.

In other words, even if an open-circuit voltage is gained immediately after an ignition is turned off, an accurate value cannot be obtained.

In addition, in the case where a power source of a battery is again switched on immediately after a power source of a battery is switched off, it is difficult to accurately display its initial residual capacity which is residual capacity at that time.

SUMMARY OF THE INVENTION

It is an object of the present invention to provide a residual capacity measuring apparatus which is capable of obtaining accurate initial residual capacity with a simple arrangement and without complex calculation when the ignition is turned on and off.

A battery residual capacity measuring apparatus of the present invention obtains residual capacity according to a current, which is supplied from a battery to a load side, and a terminal voltage so as to display the residual capacity on a display section when a power-supply voltage to be supplied is not less than a manipulation level. The battery residual capacity measuring apparatus has a power source supplying control circuit for detecting as to whether the power source is supplied or stopped and lowering a voltage of the power source to a manipulation level so as to supply the voltage for prescribed time according to the supplying of the power source.

The battery residual capacity measuring apparatus further has a residual capacity calculating section for when the power source is supplied, obtaining residual capacity according to the current and the terminal voltage and displaying the residual capacity until the current and the terminal voltage start changing, and when the current and the terminal voltage start changing, collecting a plurality of the currents and the terminal voltages and obtaining an approximately linear function so as to display the residual capacity according to the approximately linear function.

In addition, the residual capacity calculating section obtains residual capacity according to the approximately linear function immediately previous to stopping the supplying of the power source so as to display the residual capacity when the power source is again supplied within time for the power source becoming constant after the supplying of the power source.

Furthermore, the power source supplying control circuit detects as to whether the power source is supplied or stopped by detecting an auxiliary power source according to an operation of an ignition key, and the residual capacity calculating section detects as to whether the power source is supplied by detecting the auxiliary power source according to the operation of the ignition key.

In the present invention, when the power source supplying control circuit detects the stopping of power source for stopping an operation of the load, it lowers the voltage of the power source to the manipulation level accordingly so as to supply the voltage for prescribed time. For this reason, when the power source is stopped, the operation of the load is completely stopped. As a result, the residual capacity can be obtained according to the open-circuit voltage, which is the terminal voltage when the voltage of the power source is constant, so as to be displayed.

In addition, when the power source is supplied, the residual capacity calculating section does not obtain the residual capacity according to the approximately linear function based upon a plurality of data but obtains the residual capacity according to the terminal voltage of the power source so as to display the residual capacity until the current and the terminal voltage start changing. When the current and the voltage start changing, a plurality of data are collected, and the approximately linear function is obtained so that the residual capacity according to the approximately linear function is displayed.

In addition, when the power source is again supplied within time for the power source becoming constant after the power source is supplied, the residual capacity according to the approximately linear function immediately after the stopping of the power source is displayed. As a result, even if the power source is again supplied immediately after the power source is stopped, the previous residual capacity is displayed until the power source becomes constant. Therefore, the calculation is not complex.

In addition, when the ignition key is operated, the power source supplying control circuit and the residual capacity calculating section detects as to whether the auxiliary power source is supplied or stopped. The power-supply voltage which becomes not lower than the manipulation level is supplied for prescribed time for the voltage of the auxiliary power source becoming not higher than the manipulation level. Moreover, the residual capacity corresponding to the open-circuit voltage is outputted to the display section so as to be displayed according to the straight line based upon the voltage and the residual capacity in the open-circuit until the auxiliary power source is stopped and the load is closed.

For a fuller understanding of the nature and advantages of the invention, reference should be made to the ensuing detailed description taken in conjunction with the accompanying drawings.

DETAILED DESCRIPTION OF THE PREFERRED EMBODIMENTS

In the present embodiment, in the case where residual capacity of a battery mounted to an electric car is measured, the battery residual capacity measuring apparatus of the present invention is used. Moreover, an open-circuit is a state that a load is not actuated.

Figure 1:
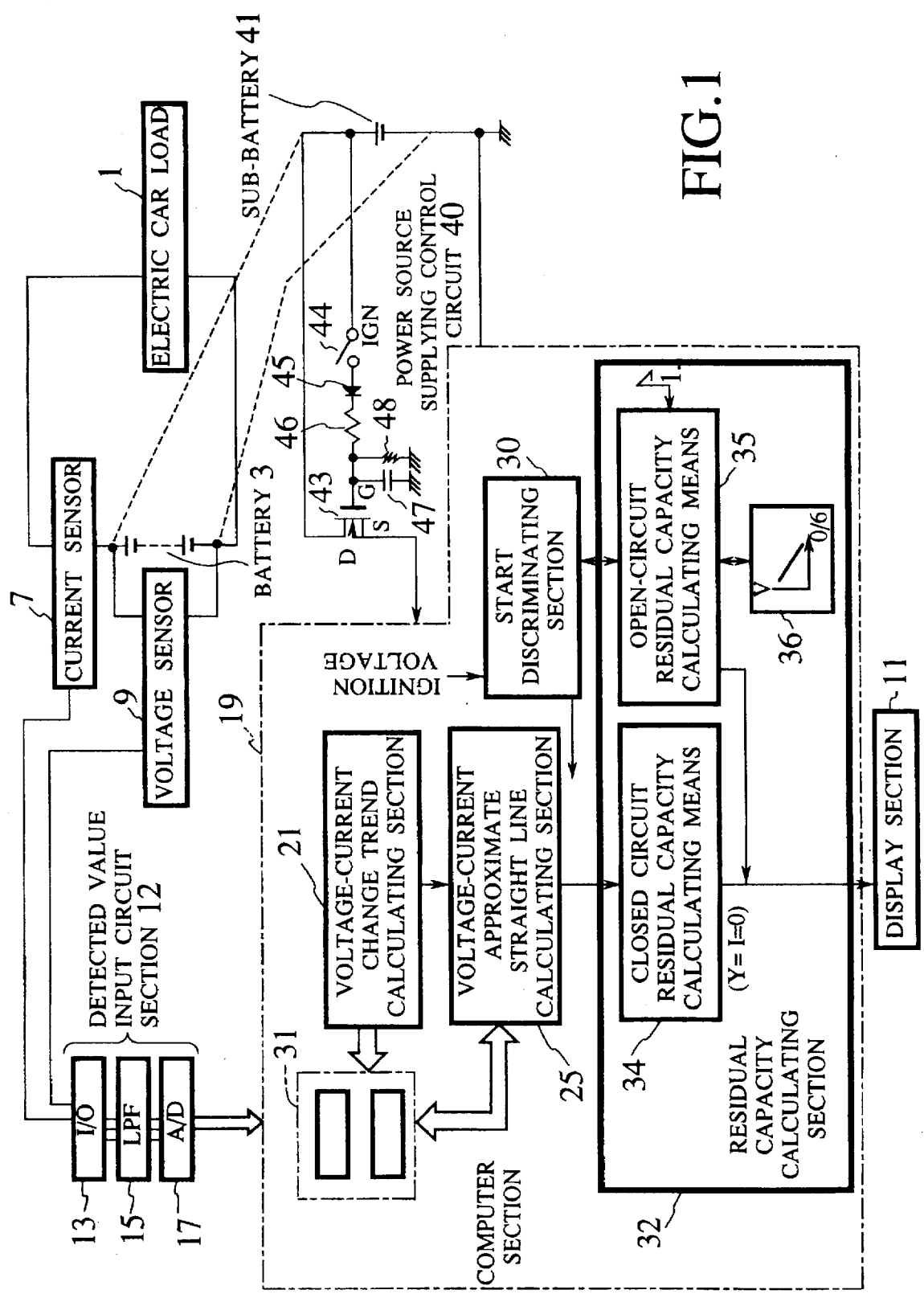
FIG. 1 is a schematic constitutional drawing of the embodiment.

FIG. 1 is a schematic constitutional drawing of the present embodiment. In FIG. 1, 1 is an electric car load (motor, for example) connected to a battery 3, 7 is a current sensor for detecting a current flows in the electric car load (i.e. load), and 9 is a voltage sensor for detecting a terminal voltage of the battery 3.

12 is a detected value input circuit section. The detected value input circuit section 12 is composed of I/O 13, LPF 15 and A/D 17. The detected value input circuit section 12 inputs a discharge current and a terminal voltage of the battery as a detected voltage and a detected current thereinto from the voltage sensor 9 and the current sensor 7. Then, the detected value input circuit section 12 eliminates noises from the detected current and detected voltage and digitally converts them.

19 is a computer. Program of the computer 19 is composed of a voltage-current change trend calculating section 21, a voltage-current approximate straight line calculating section 25, a start discriminating section 30, a residual capacity calculating section 32, etc., and the computer 19 is connected to a power source supplying control circuit 40.

The voltage-current change trend calculating section 21 inputs digital detected currents and voltages of the battery 3 therein from the detected value input circuit section 12 and samples the detected currents and the detected voltages per 1 ms. Then, the voltage-current change trend calculating section 21 calculates data, which were averaged per 100 ms, and outputs the stored contents of the memory 31 to the voltage-current approximate straight line calculating section 25 per 10 seconds.

The voltage-current approximate straight line calculating section 25 reads a plurality of voltage values and current values from the memory 31, and obtains the sum of the square of the errors of the voltage values and the current values. Then, the voltage-current approximate straight line calculating section 25 obtains values "a" and "b" for minimize the errors, and obtains a voltage-current approximately linear function (Y=aX+b) based upon "a" and "b".

In the case where an ignition is turned on and a voltage and a current of the battery 3 do not change, the start discriminating section 30 starts open-circuit residual capacity calculating means 35 of the residual capacity calculating section 32 until the battery 3 becomes stable immediately after power is supplied from the power source supplying control circuit 40. When the voltage and current start changing, the start discriminating section 30 starts closed circuit residual capacity calculating means 34. Moreover, immediately after the ignition is turned off, the start discriminating section 30 starts the open-circuit residual capacity calculating means 35 after the battery 3 becomes stable, and stops the operation of each section.

The residual capacity calculating section 32 is composed of the closed circuit residual capacity calculating means 34 and the open-circuit residual capacity calculating means 35.

The closed circuit residual capacity calculating means 34 specifies a voltage value X on a voltage axis-current axis from a predetermined discharge current value Y according to the primary formula (Y=aX+b) every time the voltage-current approximately linear function is obtained by the voltage-current approximate straight line calculating section 25, and obtains the residual capacity corresponding to the voltage value X as a percentage (1%–100%).

The open-circuit residual capacity calculating means 35 reads data from the detected value input circuit 12 (a voltage at the time of the load being stopped immediately after the ignition is turned on) according to starting, and obtains the residual capacity so as to output its percent data to the display section 11.

The power source supplying control circuit 40 has the sub-battery 41, a power MOSFET 43, a series circuit, which is composed of an ignition key switch 44, a diode 45 and a resistance 46, a capacitor 47 and a resistance 48 (for discharge). A drain of the power MOSFET 43 is connected to the sub-battery 41, and its source is connected to the computer 19. One end of the series circuit is connected to the sub-battery 41, the other end is connected to a gate of the power MOSFET 43, and the capacitor 47 is connected to the gate of the power MOSFET 43.

Figure 2:
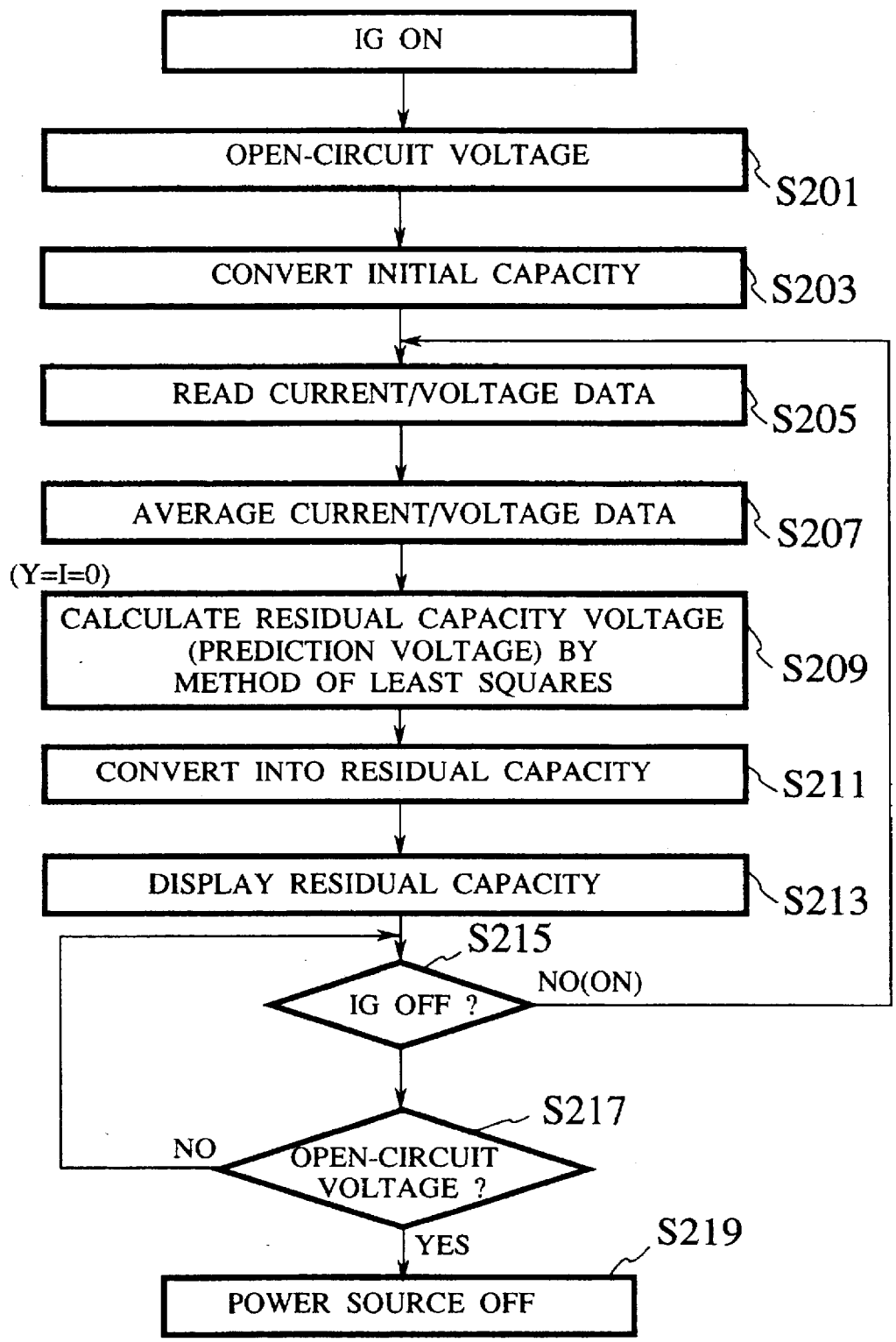
FIG. 2 is a flow chart which explains the operation of the embodiment.

The following describes the battery residual capacity measuring apparatus having the above-mentioned arrangement. FIG. 2 is a flow chart which describes the operation of the present embodiment. The present embodiment also explains the operation of the power source supplying control circuit 40 when the ignition is turned off and then turned on again.

For example, when the ignition 44 is turned on, a control signal is output to the power MOSFET 43 through the diode 45, the resistance 46 and the capacitor 47. Then, the power MOSFET 43 is turned on so that electric power of the sub-battery 41 is supplied to the computer 19.

Immediately after a current is supplied from the power source supplying control circuit 40 (immediately after the ignition is turned on), the start discriminating section 30 of the computer 19 actuates the open-circuit residual capacity calculating means 35 of the residual capacity calculating section 32. Then, the start discriminating section 30 reads open-circuit voltages detected by the voltage sensor 9 (S201), and converts initial residual capacity into percentage so as to display the percentage on the display section 11 (S203). The process in the open-circuit residual capacity calculating means 35 is mentioned later.

The open-circuit voltages are a voltages of the open circuit when a car is still standstill immediately after the on-operation of the ignition (the load is not changed), and the initial residual capacity is residual capacity according to the voltages when the car is standstill. Therefore, the residual capacity is accurate.

Next, when charging of the capacitor 47 is completed and the car starts moving, a lot of power is supplied from the power MOSFET 43. When a lot of power is supplied to the start discriminating section 30, it actuates each section excluding the open-circuit residual capacity calculating means 35. A judgment is made as to a lot of power source is supplied based upon the voltage or current value.

As a result, the voltage-current change trend calculating section 21 reads a terminal voltage of the battery 3 detected by the voltage sensor and a current (also referred to as a discharge current) detected by the current sensor 7 (S205), this sampled data are averaged (S207). Then, an approximate straight line is obtained according to the averaged data, and the intersection of the approximate straight line and a point of reference discharge current (I=0) on the voltage axis is calculated as residual capacity by the method of the least squares (S209). The residual capacity is converted into percentage by the closed circuit residual capacity calculating means 34 of the residual capacity calculating section 32 (S211) so as to be displayed (S213). The display of the percentage is changed per 1 percent.

The power source supplying control circuit 40 makes a judgment as to whether the ignition is turned off using the capacitor 47, the resistance 46 and the FET 43 (S215). When the ignition is not turned off, the control goes to the step S205, and the residual capacity is calculated by the method of the least squares. Moreover, when the ignition is turned off, a judgment is made as to whether an open-circuit voltage is obtained (S217). When the open-circuit voltage is not obtained, the control goes to the step S205 until the ignition is turned off so that the residual capacity is calculated by the method of the least squares.

When the open-circuit voltage is obtained, the power to the computer 19 is stopped so that the power is switched off (S219).

As to the steps S215 through S219, supplementary description is given. For example, when an electric car moves and stops, and the ignition is turned off, the battery does not immediately obtain an open-circuit voltage, but gradually obtains the open-circuit voltage.

In other words, in the case where the ignition is turned off and immediately turned on, the voltage of the sub-battery 41 becomes little higher than the voltage immediately after the ignition is turned off. Therefore, in the steps S215 through S217, when the ignition is turned off, the power is not turned off immediately, but turned off after a judgment is made as to whether the voltage of the sub-battery 41 obtains the same level as the open-circuit voltage by controlling the power MOSFET 43 by means of the capacitor 47 (it is set so as to have a time constant according to time required for the voltage of the sub-battery 41 having the same level as the open-circuit voltage when the ignition is turned off). For this reason, the residual capacity immediately before the ignition is turned off is displayed until the open-circuit voltage is obtained.

Next, after the ignition 44 is turned off and time required for the battery 41 obtaining the open-circuit voltage passes (for example, in the case where the car is in a garage for 1 day), when the ignition 44 is turned on, the start discriminating section 30 actuates the open-circuit residual capacity calculating means 35.

The open-circuit residual capacity calculating means 35 reads the open-circuit voltage Vn according to the starting, and residual capacity corresponding to the open-circuit voltage Vn is obtained from the memory 36 so as to be displayed.

Figure 3A:
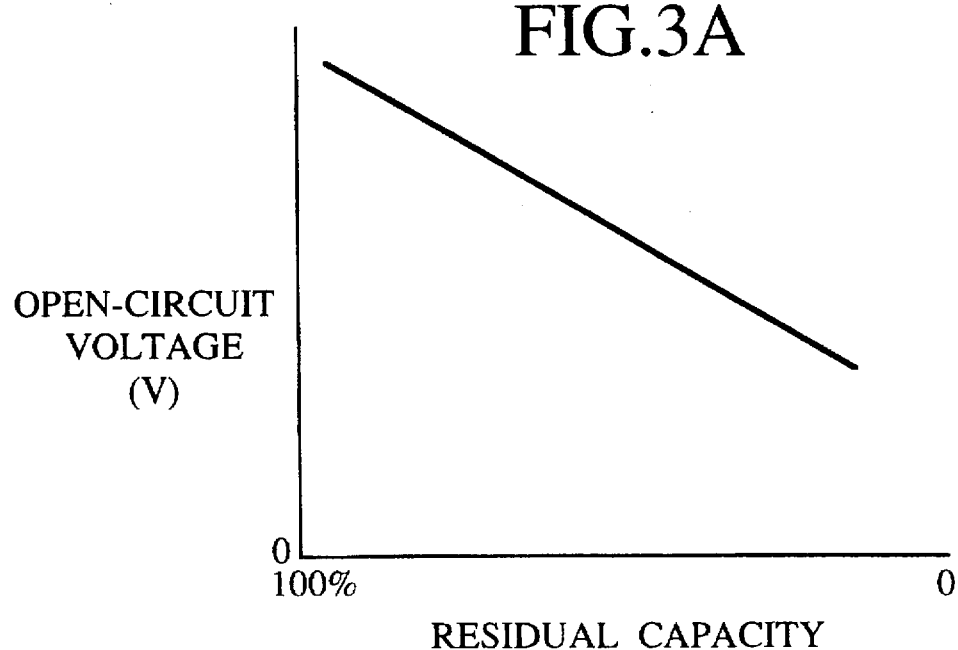
FIG. 3A is a drawing which shows a general relationship between an open-circuit voltage and residual capacity.

A relationship between the open-circuit voltage of the battery and the residual capacity of the battery when the load is closed (the car is standstill) is shown as a straight line of FIG. 3A.

Figure 3B:
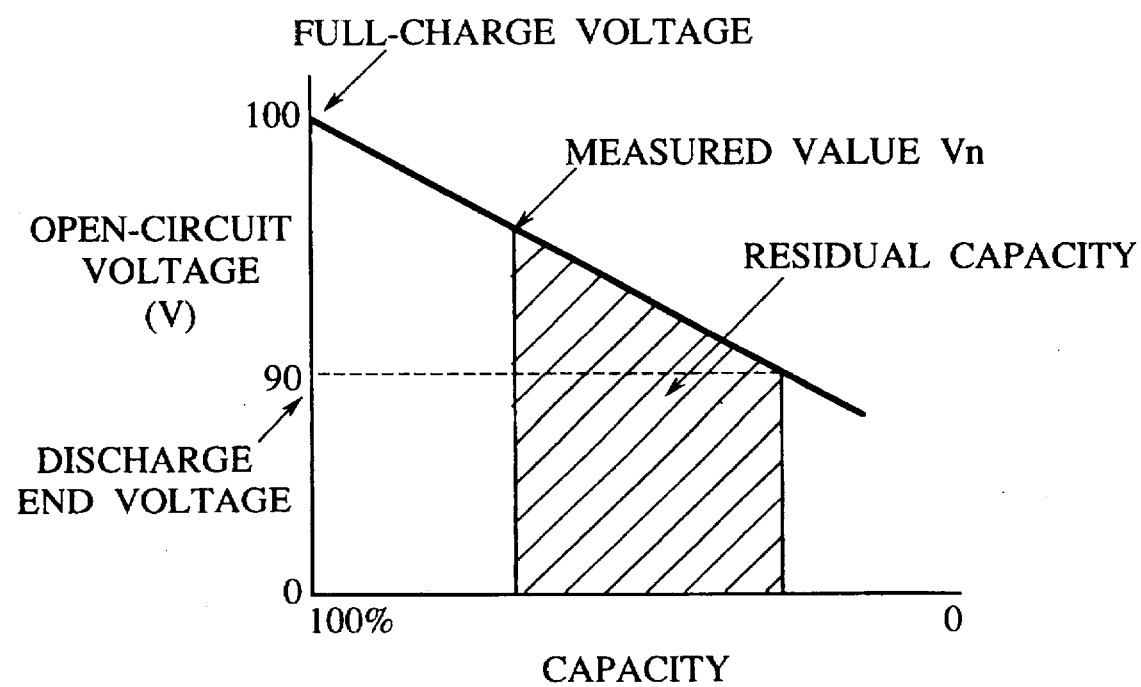
FIG. 3B is an explanatory drawing which explains a method for obtaining residual capacity corresponding to the open-circuit voltage in the present embodiment.

According to the above, when a full-charge voltage and a discharge end voltage are determined as shown in FIG. 3B, the open-circuit voltage Vn is positioned on the straight line of FIG. 3B. Therefore, the residual capacity (%) corresponding to Vn can be easily obtained. In other words, the initial residual capacity can be obtained easily and accurately.

For example, the linear function shown in formula 1, is stored in the memory 36, and when the obtained residual capacity is substituted for the formula 1, the values can be easily obtained as shown in Table 1.

Capacity of slant line section      Formula 1

$$\text{Residual capacity} = \frac{Vn - 90}{100 - 90}$$

TABLE 1

| Open-circuit voltage Vn | Residual capacity (%) |
| --- | --- |
| 100 | 100 |
| 99 | 89.5 |
| 98 | 79.2 |
| 97 | 68.9 |
| 96 | 58.7 |
| 95 | 48.7 |
| 94 | 38.7 |
| 93 | 28.9 |
| 92 | 19.2 |
| 91 | 9.5 |
| 90 | 0.0 |

In addition, a voltage of a battery becomes higher when an ambient temperature is high, and it becomes lower when an ambient temperature is low. However, when a relationship between an open-circuit voltage and residual capacity when a circuit is opened is represented by a straight line, the residual capacity corresponding to the voltage value is accurate. Therefore, the temperature sensor is not required.

The above embodiment describes the battery residual capacity measuring apparatus which is used in an electric car, but this apparatus can be also used in an apparatus whose discharge current greatly changes or is constant.

Furthermore, when regenerative braking is carried out, the battery is charged with the regenerative current. However, when the circuit is opened, since a voltage is only detected and its corresponding residual capacity is displayed, even if regaining of the residual capacity due to regenerative charging, etc. is not considered, accurate residual capacity can be obtained.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An apparatus for monitoring residual capacity of a battery, comprising:

means for sensing a discharge current, which is supplied from a battery to a load side;

means for sensing a terminal voltage of the battery;

means for calculating residual capacity of the battery based on (1) the terminal voltage of the battery whenever the battery has not experienced a discharge for a time period longer than a time-out period, and (2) an approximately linear function of the terminal voltage and the discharge current whenever the battery is experiencing a discharge;

a display section for displaying the residual capacity calculated by said calculating means; and a time-out circuit connected to the means for calculating for causing the last-calculated residual capacity to be retained for the time-out period after a discharge from the battery ceases.

2. The apparatus for monitoring residual capacity of a battery according to claim 1, wherein the means for calculating includes a residual capacity calculating section that, whenever the discharge current and the terminal voltage start changing, averages a plurality of the currents and averages a plurality of the terminal voltages on a first time scale and obtains the approximately linear function based on the respective averaged pluralities.

3. The apparatus for monitoring residual capacity of a battery according to claim 2, wherein said residual capacity calculating section obtains residual capacity according to the approximately linear function immediately previous to stopping a discharge of the battery and supplies the residual capacity thus obtained to the display section to display the residual capacity during the time-out period if a discharge of the battery is again begun during the time-out period.

4. The apparatus for monitoring residual capacity of a battery according to claim 1, 2 or 3, wherein:

the time-out circuit detects whether the battery is discharging or not by detecting an auxiliary voltage according to an operation of an ignition key, and wherein said residual capacity calculating section detects as to whether the battery is discharging or not by detecting the auxiliary voltage according to the operation of the ignition key.

5. The apparatus for monitoring residual capacity of a battery according to claim 2, wherein said residual capacity calculating section comprises means for obtaining the approximately linear function by a calculation including obtaining the sum of the squares of the voltage values and the sum of the squares of the current values on a second time scale longer than the first time scale.

* * * * *